United States Patent
Nittala et al.

(10) Patent No.: US 10,763,881 B1
(45) Date of Patent: Sep. 1, 2020

(54) METHODS OF FILTERING REFERENCE VOLTAGE NOISE

(71) Applicant: Analog Devices International Unlimited Company, Limerick (IE)

(72) Inventors: Venkata Aruna Srikanth Nittala, Bengaluru (IN); Abhilasha Kawle, Bangalore (IN); Rajasekar Rajendran, Bangalore (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/552,656

(22) Filed: Aug. 27, 2019

(51) Int. Cl.
| H03M 1/34 | (2006.01) |
| H03M 1/36 | (2006.01) |
| G05F 1/46 | (2006.01) |
| H03M 1/10 | (2006.01) |

(52) U.S. Cl.
CPC ............ *H03M 1/365* (2013.01); *G05F 1/468* (2013.01); *H03M 1/1014* (2013.01)

(58) Field of Classification Search
CPC .......................... H03M 1/365; H03M 1/1014
USPC .................. 341/155, 139, 122, 158
See application file for complete search history.

(56) References Cited

U.S. PATENT DOCUMENTS

| 7,495,589 B1 * | 2/2009 | Trifonov ............. H03M 1/1019 341/118 |
| 7,554,072 B2 * | 6/2009 | Schmidt .................... H03F 3/08 250/214 A |
| 7,808,408 B2 * | 10/2010 | Madisetti ............ H03M 1/0624 341/118 |
| 9,065,477 B2 | 6/2015 | Rajasekhar et al. |

* cited by examiner

*Primary Examiner* — Peguy Jean Pierre
(74) *Attorney, Agent, or Firm* — Schwegman Lundberg & Woessner, P.A.

(57) ABSTRACT

A voltage reference noise filter is provided that substantially eliminates noise with minimal external components for any circuit where the reference load current is a constant load and the circuit uses external components that have values that may vary with temperature, over time, and the like. The drift on an output of a voltage reference due to variation of resistor of the external filter is mitigated by moving the external resistor onto the chip containing the circuit. The voltage drop across the resistor is digitally compensated by a scaling factor determined during calibration. When more than one converter is provided on the chip, a further adjustment to the outputs of the converters is made based on the number of converters powered on or off. Also, error in output of converters due to mismatch among the converters is digitally compensated by a further scaling factor.

20 Claims, 4 Drawing Sheets

METHODS OF FILTERING REFERENCE VOLTAGE NOISE

FIELD OF THE DISCLOSURE

This document relates to an apparatus to filter external reference noise for any circuit having a constant reference load current and, in particular, to a reference voltage noise filter for analog-to-digital or digital-to-analog converters where the reference load current is a constant load.

BACKGROUND

Analog-to-digital converters (ADCs) and, in particular, continuous-time sigma-delta modulators (CTSDMs) are gaining popularity due to power-efficient operation well-suited for high-speed, high-performance systems. In a CTSDM, typically an input analog signal that varies over time is converted into a digital stream that represents the input with high fidelity in the frequency band of interest. This digital stream then goes through digital post-processing (typically decimation) to provide the final digital code stream which represents the analog input signal in the digital domain with high fidelity.

However, in one approach, CTSDMs use a current digital-to-analog converter (DAC) in a feedback path that can suffer from input-dependent reference errors. Though techniques such as quad-switching have been used to address such errors, CTSDMs as well as other ADCs and DACs are also susceptible to external reference noise. For example, values of external components such as voltage references may drift with temperature and over time, which adversely impacts performance.

SUMMARY OF THE DISCLOSURE

This document relates to a voltage reference noise filter for any circuit like an analog-to-digital converter (ADC) or digital-to-analog converter (DAC) where the reference load current is a constant load and the circuit uses external components that have values that may vary with temperature, over time, and the like. While the implementation illustrated in sample embodiments is shown for an ADC, it will be appreciated that the techniques described herein may be extended to any circuit that receives a substantially constant current from a voltage reference source.

In sample embodiments, a circuit is provided that comprises a converter (e.g., an analog-to-digital converter (ADC) or digital-to-analog converter (DAC)), that receives an input voltage at an input terminal and compares the input voltage to a voltage reference received at a reference terminal from a voltage reference circuit. A resistor is connected at a first end to the voltage reference circuit and at a second end to the reference terminal of the converter. Also, the circuit may further include a reference capacitor terminal connected to the second end of the resistor. The reference capacitor terminal connects the second end of the resistor to a capacitor to form a filter that filters an output of the voltage reference circuit.

A reference gain trimming circuit compensates the voltage drop across the resistor using a scaling factor selected to compensate for a gain error caused by the voltage drop across the resistor. A multiplier of the reference gain trimming circuit multiplies an output of the converter by the scaling factor.

In other sample embodiments, a circuit is provided that comprises at least two converters (e.g., continuous-time sigma-delta analog-to-digital converters) that receive input reference voltages at respective input terminals and compare the input voltages to a voltage reference received at respective reference terminals from a voltage reference circuit. A resistor is connected at a first end to the voltage reference circuit and at a second end to the reference terminals of the respective converters. A reference gain trimming circuit is provided that stores a scaling factor selected to compensate a gain error caused by voltage drop across the resistor and that multiplies respective outputs of the converters by the scaling factor.

In sample embodiments, the reference gain trimming circuit includes a digital memory that stores the scaling factor. The scaling factor has a value calculated during a calibration process for the circuit to compensate a voltage drop across the resistor upon application of the voltage reference to the first end of the resistor when all the converters are turned on. The reference gain trimming circuit may further include a multiplier that multiplies respective outputs of the converters by the scaling factor and by a second scaling factor having a value of L/M where M is a total number of converters and L is a number of the total number of converters that are turned on. The multiplier may further multiply respective outputs of the converters by additional scaling factors to compensate output voltage differences between respective ADCs when the ADCs are not of the same type.

In sample embodiments, the resistor is on the same semiconductor chip as the converter(s) and the reference gain trimming circuit. Optionally, the voltage reference circuit may be on the same semiconductor chip. The resistor may be made of the same material type as the converter to reduce gain drift with temperature.

In other sample embodiments, a circuit is provided that includes a converter (e.g., an ADC or a DAC) that receives an input voltage at an input terminal and compares the input voltage to a voltage reference received at a reference terminal from a voltage reference circuit. A resistor is connected at a first end to the voltage reference circuit and at a second end to the reference terminal of the converter. Reference gain trimming means compensate an output of the converter to adjust for a gain error caused by voltage drop across the resistor using a scaling factor selected to compensate the gain error caused by voltage drop across the resistor. In sample embodiments, the reference gain trimming means includes a digital memory that stores the scaling factor, which is calculated during a calibration process for the circuit to compensate a voltage drop across the resistor upon application of the voltage reference to the first end of the resistor, and a multiplier that multiplies the output of the converter by the scaling factor. In other sample embodiments, the reference gain trimming means includes a field programmable gate array (FPGA) or a controller algorithm adapted to adjust the output of the converter to compensate for the drop across the resistor.

Sample embodiments further include a method including receiving an input voltage at an input terminal of a circuit, comparing the input voltage to a voltage reference received at a reference terminal of the circuit from a voltage reference circuit, and compensating gain error due to voltage drop across a resistor connected at a first end to the voltage reference circuit and at a second end to the reference terminal of the circuit by multiplying an output of the circuit by a scaling factor selected to compensate a gain error caused by voltage drop across the resistor.

In further sample embodiments, the input voltage is received at input terminals of at least two converters. In such case, the method includes compensating respective outputs of the converters by multiplying the respective outputs by a second scaling factor having a value of L/M where M is a total number of converters and L is a number of the total number of converters that are turned on. The method may further include multiplying respective outputs of the converters by additional scaling factors to compensate output voltage differences between respective converters when the converters are not of the same type. In sample embodiments, the circuit and resistor are disposed on a same semiconductor chip and the scaling factor is determined by conducting background calibration and/or by measuring voltage drop across the resistor at power-up of the semiconductor chip during a calibration process.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description with respect to FIGS. 1-6 sufficiently illustrates specific embodiments to enable those skilled in the art to practice them. Other embodiments may incorporate structural, logical, process, and other changes. Portions and features of some embodiments may be included in, or substituted for, those of other embodiments. Embodiments set forth in the claims encompass all available equivalents of those claims. The example embodiments are presented for illustrative purposes only and are not intended to be restrictive or limiting on the scope of the disclosure or the claims presented herein.

The following disclosure will describe a voltage reference noise filter for any circuit like an analog-to-digital converter (ADC) or digital-to-analog converter (DAC) where the reference load current is a constant load and the circuit uses external components that have values that may vary with temperature, over time, and the like. While the implementation illustrated in sample embodiments is shown for an ADC, it will be appreciated that the techniques described herein may be extended to any circuit that receives a constant reference load current.

An ADC samples and digitizes analog input to provide a digital output in accordance with the general equation:

$$Dout_{ideal}=Vin*2^N/Vref \quad (1)$$

Where:
Vin=Input voltage level;
Vref=Voltage reference of the ADC,
N=Number of bits, and
$Dout_{ideal}$=Ideal digital output.

Figure 1:
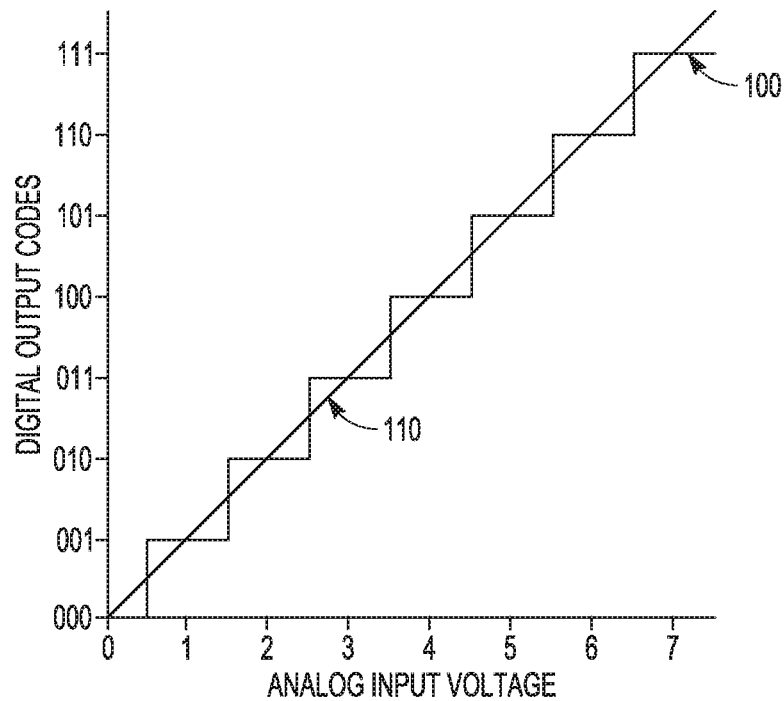
FIG. 1 illustrates the transfer function of a sample 3-bit analog-to-digital converter (ADC).

For a 3-bit ADC, the transfer function ideally would look like the transfer function 100 illustrated in FIG. 1 where the digital output codes linearly track the input analog voltage 110.

However, as illustrated by Equation (1), the ideal digital output $Dout_{ideal}$ is a function of Vref which generally contains off-chip components that interact with the on-chip ADC. Accordingly, any error in ref causes a corresponding error in the digital output. For example, noise in Vref causes degradation in Signal-to-Noise Ratio (SNR) of the ADC. Also, any errors in the value of Vref may cause a gain error and a linearity error that limits the maximum range of the ADC.

Figure 2:
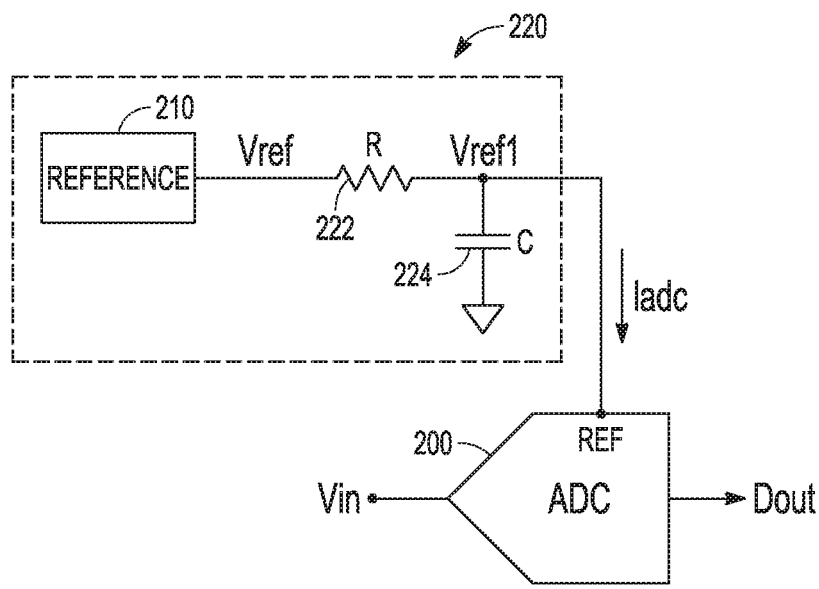
FIG. 2 illustrates an ADC connected to a reference voltage having a passive filter for reducing noise.

To reduce noise of Vref, a passive filter may be used as shown in FIG. 2, which illustrates an ADC 200 that receives a voltage reference ref from voltage reference 210 via a passive filter 220 including resistor R 222 and capacitor C 224. In this configuration, if the filter output Vref1 is directly connected to the reference input REF of the ADC 200 as shown in FIG. 2, the current Iadc through the resistor R 222 will cause a voltage drop defined by the following equation:

$$Vref1=Vref-Iadc*R \quad (2)$$

In this case:

$$Dout=Vin*2^N/Vref1 \quad (3)$$

This leads to gain error in the ADC output that is proportionate to the voltage drop across resistor R 222.

Also, gain error will further be dependent on the number of ADCs connected to the reference voltage Vref. For example, if 'M' ADCs are connected to the voltage reference Vref, then the value of Vref1 may be defined by the following equation:

$$Vref1=Vref-M*Iadc*R \quad (4)$$

In addition, Iadc and R will drift with temperature and over time. Since the resistor R 222 is external to the ADC, these two drifts cannot cancel each other. As a result, there will be a gain drift with temperature.

Moreover, as noted above, in some configurations Iadc may be input signal dependent, which will cause Vref1 to also have a signal dependent error. In such as case, the current from the voltage reference 210 input into the ADC (Iadc) may be defined as:

$$Iadc=I+Ierror_{vin} \quad (5)$$

$Ierror_{vin}$ will further cause signal dependent error in the reference voltage as follows:

$$Vref1=Vref-(1+Ierror_{vin})*R \quad (6)$$

The value of $Ierror_{vin}$ thus further leads to a linearity error.

Figure 3:
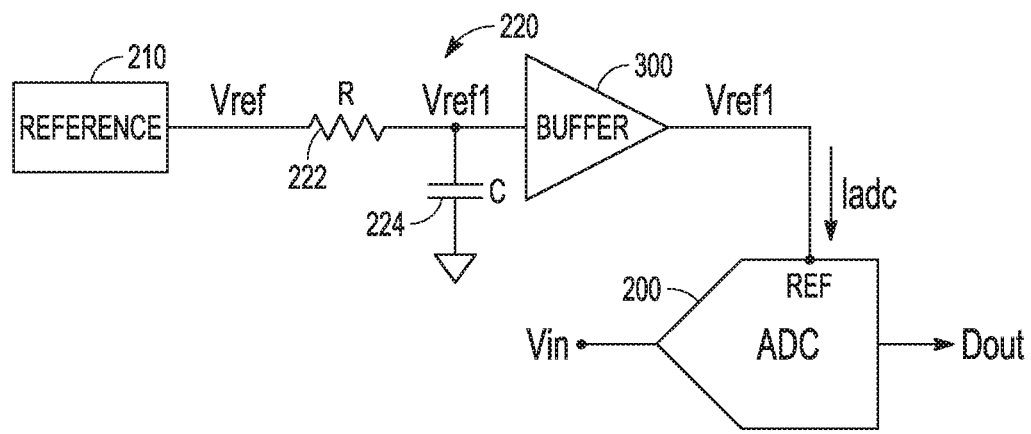
FIG. 3 illustrates an ADC connected to a reference voltage having a passive filter and a buffer for reducing gain error and input signal dependent error.

To address these gain and linearity errors, a buffer 300 may be inserted after the passive filter 220 as illustrated in FIG. 3. Generally, the buffer 300 is designed to substantially prevent the signal source from being affected by currents or voltages that the load may produce. Thus, in FIG. 3, the buffer 300 prevents loading of the voltage reference 210 by the ADC 200 unacceptably and interfering with its operation. An ideal buffer 300 is perfectly linear, regardless of signal amplitudes.

U.S. Pat. No. 9,065,477 describes a linear and DC accurate feedback DAC for a continuous-time sigma-delta (CTSD) ADC that ensures that for a CTSD, Iadc is not input signal dependent. The circuits described in U.S. Pat. No. 9,065,477 ensure that the reference input impedance is resistive and that current through the reference input is constant so as to allow a direct connection of the reference voltage circuit to the ADC without a buffer. The noise of the reference voltage circuit may be filtered by using an external RC filter.

The disclosed circuit mitigates against non-linearity due to input dependent switching activity by using different parallel switches consecutively to provide one of the states during one cycle, where each of the switches is activated for approximately half of the cycle. Activating different switches during one cycle to provide the same state may reduce the non-linear nature of the DAC element in the CTSD ADC due to input dependent switching activity. The non-linear nature of the DAC element may be reduced because the output current does not depend on just one switch resistance that is in use during the whole cycle. Instead, the output current depends on the average of multiple switch resistances. Also, because the number of switches switching may be constant every cycle, any charge injection due to the switches may be input code independent. As a result, the reference current is substantially constant and the voltage reference does not have the error shown in Equation (6).

Thus, the configuration in U.S. Pat. No. 9,065,477 may be used to remove linearity errors in the reference current. As a result, the buffer 300 need not be used and the output of the passive filter 220 may be applied directly to the ADC 200, thereby simplifying the connection to the reference voltage 210, as in FIG. 2. Further, removal of buffer saves power, area required for the buffer, and the additional noise contributed by the buffer.

However, the gain error in the ADC 200 shown in Equation (2) due to the drop across the resistor R 222 of the passive filter 220 is still present. Also, since resistor R 222 is external to the ADC 200 chip, the resistor R 224 may cause gain drift with temperature. This problem is further addressed by the embodiments described below with respect to FIG. 4 and FIG. 5.

Figure 4:
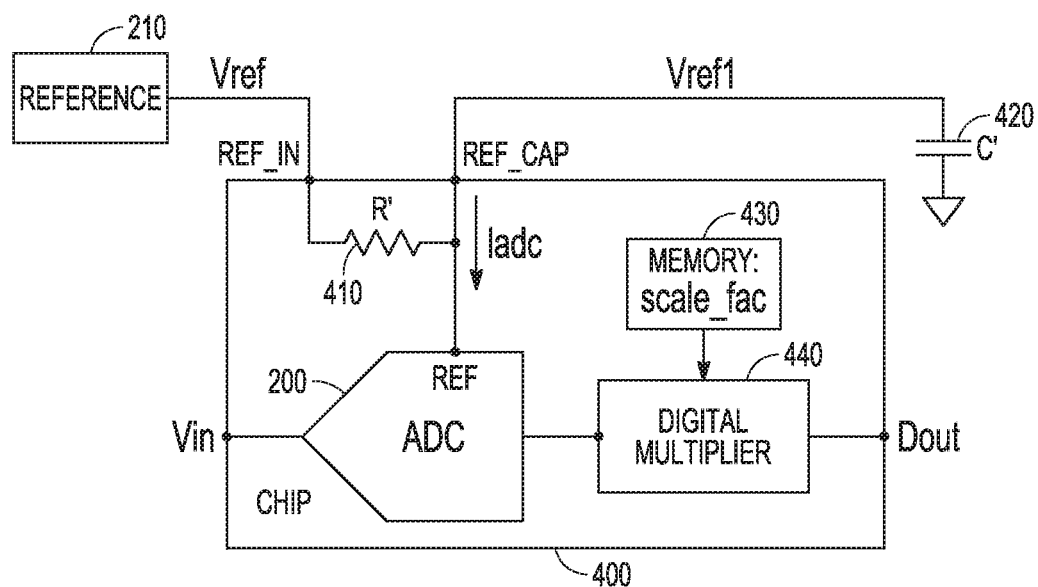
FIG. 4 illustrates an ADC where the resistor of the passive filter is moved on-chip with the ADC in accordance with sample embodiments.

The following embodiments address the gain drift of the resistor R 222 by moving the resistor R 222 from the passive filter 220 onto the chip containing the ADC 200 and to correct for the voltage drop across the resistor digitally to ensure no gain error and to guarantee the full input range of the ADC 200 irrespective of the number of ADCs powered on or off. For example, FIG. 4 illustrates a sample embodiment where the resistor R 222 of the configuration of FIG. 2 is moved onto chip 400. As illustrated, the resistor R' 410 is placed on chip 400 between the REF_IN terminal connected to the external reference voltage 210 and the REF_CAP terminal connected to the external capacitor C' 420. In this configuration, at setup, the user selects a capacitor C' 420 for connection to the REF_CAP terminal of the chip 400 based on the amount of filtering required. Since this value may vary, resistor 410 and capacitor 420 are demarcated with an apostrophe to indicate that they need not have the same values as the corresponding external elements in FIGS. 2-3 above. Also, the on-chip resistor R' 410 and Iadc may be designed to drift in the same direction so as to cancel any gain drift with temperature and time. In a sample embodiment, R' may have a value of 20 ohms and is made of the same material type as the on-chip ADCs 200 so as to track any changes versus temperature and time. Also, in other sample embodiments, the capacitor 420 also may be placed on-chip. In sample embodiments, the chip 400 may be a semiconductor configured to include one or more converter circuits as described herein.

To get a correct digital output with respect to Vref as in Equation (1), a scaling factor is introduced, that has a value determined during a calibration process during production. The calibration process may be conducted on-chip using circuits to measure voltage drop at power-up of the chip, background calibration, or whenever calibration is initiated. In particular, Equation (1) is modified as follows:

$$Dout=Vin*2^N/Vref1*(1-\text{scale\_fac}) \quad (7)$$

Combining Equations (2) and (7), the resulting equation is:

$$\text{scale\_fac}=(Iadc*R)/Vref \quad (8)$$

Equation (2) shows that Vref1 is function of Iadc and R, which are process dependent so can vary from device to device. Thus, for each device, during production, Vref and Vref1 are measured and the scale_fac is calculated and stored in a digital memory 430 on the chip 400 to be multiplied with the ADC output by digital multiplier 440 as shown in FIG. 4. This procedure is referred to as reference gain trimming and, in the embodiment of FIG. 4, the scale_fac from the digital memory 430 and the digital multiplier 440 provide means for providing the reference gain trimming. In sample embodiments, digital memory 430 may be a 20-bit fuse register memory element.

In the case of a multi-channel ADC on a single chip, Vref1 may change based on the number of ADCs that are powered-on and connected to Vref1. In this case, another scale factor is needed to account for the number of ADCs that are turned on.

Figure 5:
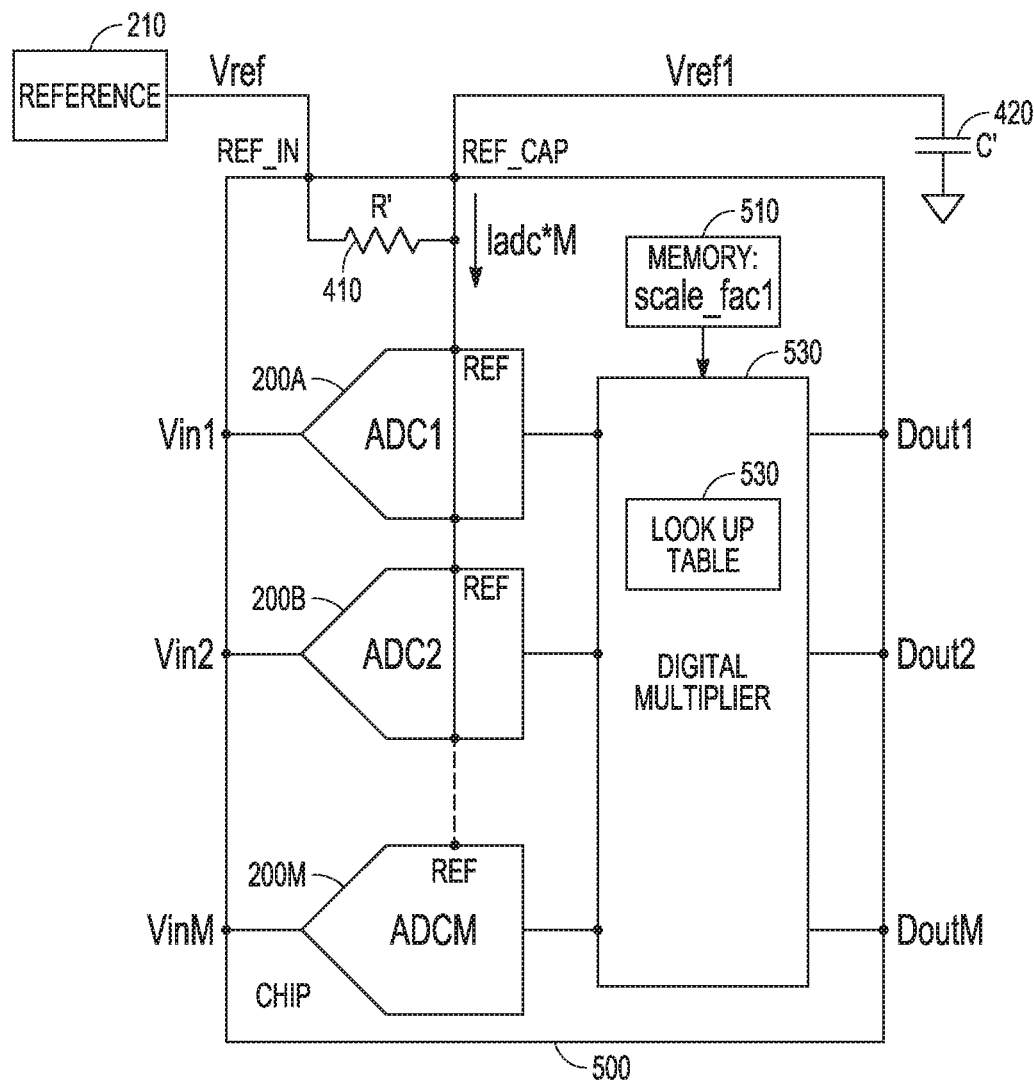
FIG. 5 illustrates a multi-channel ADC with an on-chip resistor for the passive filter that implements digital reference error trimming in accordance with sample embodiments.

FIG. 5 illustrates a multi-channel ADC on chip 500 having a single on-chip resistor R' 410 that together with external capacitor C' 420 constitutes a passive filter. In the embodiment of FIG. 5, chip 500 has M identical ADCs 200A, 200B, . . . , 200M connected to the same reference voltage 210 via the REF_IN terminal and resistor R' 410 and via the REF_CAP terminal to the external capacitor C' 420. In sample embodiments, the ADCs 200A, 200B, . . . , 200M may be ADCs of the type described in U.S. Pat. No. 9,065,477, mentioned above. When all ADCs 200A, 200B, . . . 200M are on, then Equation (4) is modified as follows:

$$Vref1=Vref-M*Iadc*R \quad (9)$$

If only 'L' out of M ADCs 200A, 200B, . . . , 200M are on, then:

$$Vref1=Vref-(L/M)*M*Iadc*R=Vref-L*Iadc*R \quad (10)$$

From Equations (1), (3), and (10), the correct digital output may be obtained with respect to Vref as in Equation (1) by introducing a second scaling factor such that:

$$Dout=Vin*2^N/Vref1*(1-\text{scale\_fac1}*\text{scale\_fac2}) \quad (11)$$

where:

$$\text{scale\_fac1}=(M*Iadc*R)/Vref \quad (12)$$

and $$\text{scale\_fac2}=L/M \quad (13)$$

For multiple ADCs, scale_fac1 is calculated with all ADCs ON and stored in memory 510 during production as in the embodiment of FIG. 4. Then, based on the number of ADCs turned on, the scale_fac2 is scaled digitally by digital multiplier 520 using Equation (12). In a sample embodiment, scale_fac2 may be stored in a lookup-table 530.

For example, in an implementation of chip 500 with four ADCs, the reference input REF_IN receives around 3 k/6 k ohms impedance for each ADC channel in high performance/low performance modes, respectively. In such an implementation, scale_fac2 may be stored in look-up table 530 as follows:

scale_fac2=1 for all 4 ADCs on;
scale_fac2=0.75 for 3 ADCs on;
scale_fac2=0.5 for 2 ADCs on; and
scale_fac2=0.25 for 1 ADC on.

During operation, the appropriate value for scale_fac2 is selected from the look up table 530 based on the number of ADCs that are turned on, while scale_fac1 from memory 510 is multiplied with the respective ADC outputs by digital multiplier 520 to apply reference gain trimming as in the embodiment of FIG. 4. It will also be appreciated that additional scaling factors may be multiplied with outputs of the ADCs to compensate output voltage differences between respective ADCs in configurations where the ADCs are not all of the same type or on the same chip 500. Such additional scaling factors may be stored in memory 510, in look-up table 530, or in a separate memory element.

Thus, FIG. 4 and FIG. 5 illustrated implementations of a reference voltage noise filter that may be used with ADCs such as a continuous time sigma-delta (CTSD) ADC as well as DACs to substantially eliminate noise with minimal external components. The embodiments of FIG. 4 and FIG. 5 do not experience channel dependent gain error and support the full scale of the input range. However, it will be appreciated that the techniques described with respect to FIG. 4 and FIG. 5 may be extended to any circuit requiring a voltage reference with a constant load current. Also, the embodiments of FIG. 4 and FIG. 5 are described with respect to an on-chip implementation. It will be further appreciated that the techniques may be extended to any system level implementation and that the resistor may be implemented externally if regulated by reference gain trimming means such as a field programmable gate array (FPGA) or controller algorithm adapted to adjust the output of the converter(s) to compensate for the drop across the resistor. It will also be appreciated that the voltage reference 210 may be implemented on-chip in certain configurations, thereby further minimizing voltage errors due to temperature and gain drift.

Figure 6:
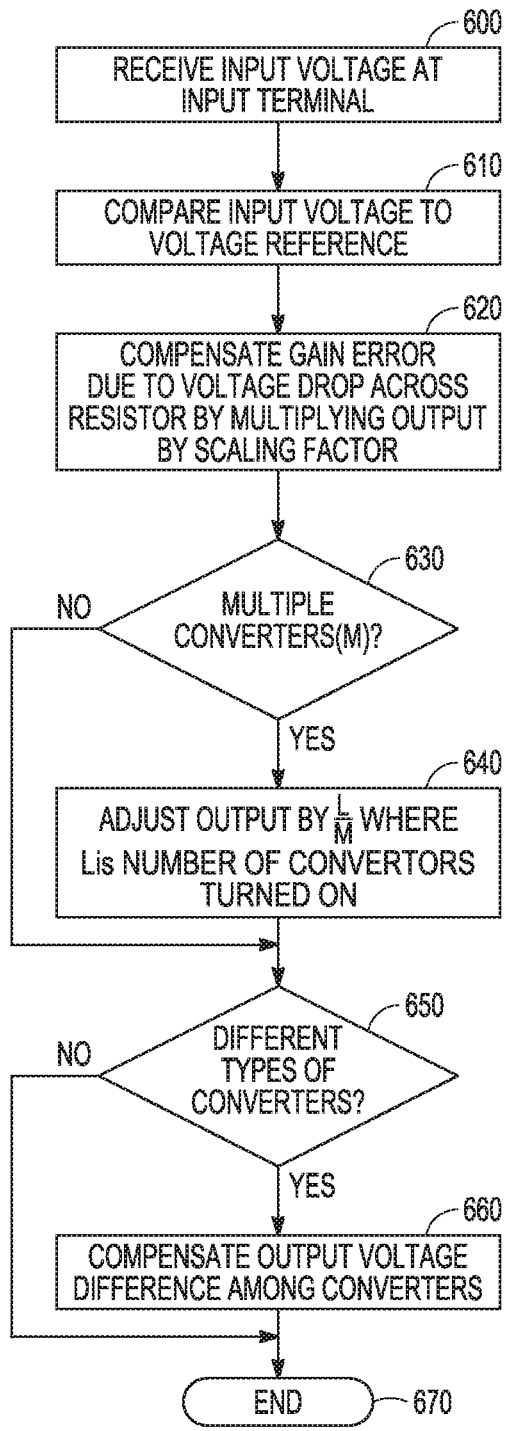
FIG. 6 illustrates a flow chart of a method of compensating a voltage drop across a resistor of the passive filter in sample embodiments.

FIG. 6 illustrates a flow chart of a method of compensating a voltage drop across a resistor of the passive filter on the output of the reference voltage 210 in sample embodiments. As illustrated, the method includes receiving an input voltage at an input terminal of a converter at 600, where the converter may be an ADC or a DAC in sample embodiments. At 610, the input voltage of the converter is compared to a voltage reference received at a reference terminal of the converter from a voltage reference circuit. The gain error due to voltage drop across a resistor connected at a first end to the voltage reference circuit and at a second end to the reference terminal of the converter is compensated at 620 by multiplying an output of the converter by a scaling factor selected to compensate a gain error caused by voltage drop across the resistor.

The method further determines at 630 whether multiple converters (M) are present. When so, the input voltage is received at input terminals of the respective converters and the respective outputs of the converters are compensated at 640 by multiplying the respective outputs by a second scaling factor having a value of L/M where M is the total number of converters and L is a number of the total number of converters that are turned on. Also, the method includes checking at 650 whether the converters are of different types. When so, the output voltages of the converters are further compensated at 660 by multiplying respective outputs of the converters by additional scaling factors to compensate output voltage differences among the respective converters. The process then ends at 670.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A circuit comprising:
   a converter that receives an input voltage at an input terminal and compares the input voltage to a voltage reference received at a reference terminal from a voltage reference circuit;
   a resistor connected at a first end to the voltage reference circuit and at a second end to the reference terminal of the converter; and
   a reference gain trimming circuit comprising a memory that stores a scaling factor having a value selected to compensate a gain error caused by voltage drop across the resistor upon application of the voltage reference to the first end of the resistor, and a multiplier that multiplies an output of the converter by the scaling factor.

2. The circuit of claim 1, wherein the converter, resistor, and reference gain trimming circuit are all on a same semiconductor chip.

3. The circuit of claim 2, wherein the voltage reference circuit is on the same semiconductor chip.

4. The circuit of claim 2, further comprising a reference capacitor terminal connected to the second end of the resistor, the reference capacitor terminal connecting the second end of the resistor to a capacitor to form a filter that filters an output of the voltage reference circuit.

5. The circuit of claim 1, wherein the converter comprises an analog-to-digital converter.

6. The circuit of claim 1, wherein the memory comprises a digital memory and the scaling factor has a value calculated during a calibration process for the circuit to compensate the voltage drop across the resistor upon application of the voltage reference to the first end of the resistor.

7. The circuit of claim 1, wherein the resistor is made of a same material type as the converter.

8. The circuit of claim 1, further comprising at least two converters that receive input voltages at respective input terminals and compare the input voltages to the voltage reference received at respective reference terminals from the voltage reference circuit, wherein the resistor is connected at the second end to the reference terminals of the respective converters and the multiplier multiplies respective outputs of the converters by the scaling factor.

9. The circuit of claim 8, wherein the multiplier multiplies respective outputs of the converters by the scaling factor and by a second scaling factor having a value of L/M where M is a total number of converters and L is a number of the total number of converters that are turned on.

10. The circuit of claim 9, wherein the multiplier further multiplies respective outputs of the converters by additional scaling factors to compensate output voltage differences between respective converters when the converters are not of the same type.

11. The circuit of claim 8, wherein the scaling factor has a value calculated during a calibration process for the circuit to compensate a voltage drop across the resistor upon application of the voltage reference to the first end of the resistor when all the converters are turned on.

12. The circuit of claim 8, wherein the converters, resistor, and reference gain trimming circuit are all on a same semiconductor chip.

13. The circuit of claim 12, further comprising a reference capacitor terminal connected to the second end of the resistor, the reference capacitor terminal connecting the second end of the resistor to a capacitor to form a filter that filters an output of the voltage reference circuit.

14. A circuit comprising:
    a converter that receives an input voltage at an input terminal and compares the input voltage to a voltage reference received at a reference terminal from a voltage reference circuit;
    a resistor connected at a first end to the voltage reference circuit and at a second end to the reference terminal of the converter; and
    reference gain trimming means for compensating an output of the converter to adjust for a gain error caused by voltage drop across the resistor by multiplying an output of the converter by a scaling factor having a value selected to compensate the gain error caused by voltage drop across the resistor upon application of the voltage reference to the first end of the resistor.

15. The circuit of claim 14, wherein the reference gain trimming means comprises a digital memory that stores the scaling factor, the scaling factor having a value calculated during a calibration process for the circuit to compensate the voltage drop across the resistor upon application of the voltage reference to the first end of the resistor, and a multiplier that multiplies the output of the converter by the scaling factor.

16. The circuit of claim 14, wherein the reference gain trimming means comprises one of a field programmable gate array (FPGA) and a controller algorithm adapted to adjust the output of the converter to compensate for the drop across the resistor.

17. A method comprising:
    receiving an input voltage at an input terminal of a circuit;
    comparing the input voltage to a voltage reference received at a reference terminal of the circuit from a voltage reference circuit; and
    compensating gain error due to voltage drop across a resistor connected at a first end to the voltage reference circuit and at a second end to the reference terminal of the circuit by multiplying an output of the circuit by a scaling factor having a value selected to compensate a gain error caused by voltage drop across the resistor upon application of the voltage reference to the first end of the resistor.

18. The method of claim 17, wherein the input voltage is received at input terminals of at least two converters, further comprising compensating respective outputs of the converters by multiplying the respective outputs by a second scaling factor having a value of L/M where M is a total number of converters and L is a number of the total number of converters that are turned on.

19. The method of claim 18, further comprising multiplying respective outputs of the converters by additional scaling factors to compensate output voltage differences between respective converters when the converters are not of the same type.

20. The method of claim 17, wherein the circuit and resistor are disposed on a same semiconductor chip, further comprising determining the scaling factor by conducting at least one of background calibration and by measuring voltage drop across the resistor at power-up of the semiconductor chip during a calibration process.

* * * * *